United States Patent
Carey et al.

(10) Patent No.: US 12,040,415 B2
(45) Date of Patent: Jul. 16, 2024

(54) HIGH SPEED PHOTOSENSITIVE DEVICES AND ASSOCIATED METHODS

(71) Applicant: SiOnyx, LLC, Beverly, MA (US)

(72) Inventors: James E. Carey, Ann Arbor, MI (US); Drake Miller, Tigard, OR (US)

(73) Assignee: SIONYX, LLC, Beverly, MA (US)

( * ) Notice: Subject to any disclaimer, the term of this patent is extended or adjusted under 35 U.S.C. 154(b) by 55 days.

(21) Appl. No.: 17/514,775

(22) Filed: Oct. 29, 2021

(65) Prior Publication Data

US 2022/0052210 A1 Feb. 17, 2022

Related U.S. Application Data

(63) Continuation of application No. 16/708,335, filed on Dec. 9, 2019, now abandoned, which is a continuation of application No. 15/679,827, filed on Aug. 17, 2017, now Pat. No. 10,505,054, which is a continuation of application No. 14/580,143, filed on Dec. 22, 2014, now Pat. No. 9,761,739, which is a continuation of application No. 13/164,630, filed on Jun. 20, 2011, now abandoned.

(60) Provisional application No. 61/356,536, filed on Jun. 18, 2010.

(51) Int. Cl.
| | |
|---|---|
| H01L 31/0236 | (2006.01) |
| H01L 27/144 | (2006.01) |
| H01L 27/146 | (2006.01) |
| H01L 31/02 | (2006.01) |
| H01L 31/028 | (2006.01) |
| H01L 31/103 | (2006.01) |

(52) U.S. Cl.
CPC .... *H01L 31/02024* (2013.01); *H01L 27/1446* (2013.01); *H01L 27/14629* (2013.01); *H01L 27/14643* (2013.01); *H01L 31/02363* (2013.01); *H01L 31/028* (2013.01); *H01L 31/103* (2013.01); *Y02E 10/50* (2013.01)

(58) Field of Classification Search
None
See application file for complete search history.

(56) References Cited

U.S. PATENT DOCUMENTS

| | | | | |
|---|---|---|---|---|
| 4,277,793 A | * | 7/1981 | Webb | H01L 31/02161 257/466 |
| 8,946,839 B1 | * | 2/2015 | Yap | H01L 31/035227 257/E31.093 |
| 2004/0112426 A1 | * | 6/2004 | Hagino | H01L 31/0236 257/E31.13 |

(Continued)

*Primary Examiner* — Sarah K Salerno
(74) *Attorney, Agent, or Firm* — Troutman Pepper Hamilton Sanders LLP (Rochester)

(57) ABSTRACT

High speed optoelectronic devices and associated methods are provided. In one aspect, for example, a high speed optoelectronic device can include a silicon material having an incident light surface, a first doped region and a second doped region forming a semiconductive junction in the silicon material, and a textured region coupled to the silicon material and positioned to interact with electromagnetic radiation. The optoelectronic device has a response time of from about 1 picosecond to about 5 nanoseconds and a responsivity of greater than or equal to about 0.4 A/W for electromagnetic radiation having at least one wavelength from about 800 nm to about 1200 nm.

17 Claims, 8 Drawing Sheets

(56) References Cited

U.S. PATENT DOCUMENTS

| | | | |
|---|---|---|---|
| 2009/0305456 A1* | 12/2009 | Funakoshi | H01L 31/02363 438/669 |
| 2010/0037943 A1* | 2/2010 | Sater | H01L 31/0352 257/E31.13 |
| 2010/0237187 A1* | 9/2010 | Butler | B64D 29/04 244/54 |
| 2011/0100441 A1* | 5/2011 | Mazur | H01L 31/186 438/57 |
| 2012/0040490 A1* | 2/2012 | Gallazzo | H01L 31/0288 257/E31.124 |
| 2013/0037102 A1* | 2/2013 | Isaka | H01L 31/0682 257/E31.124 |
| 2013/0206219 A1* | 8/2013 | Kurtin | H01L 31/048 136/255 |

* cited by examiner

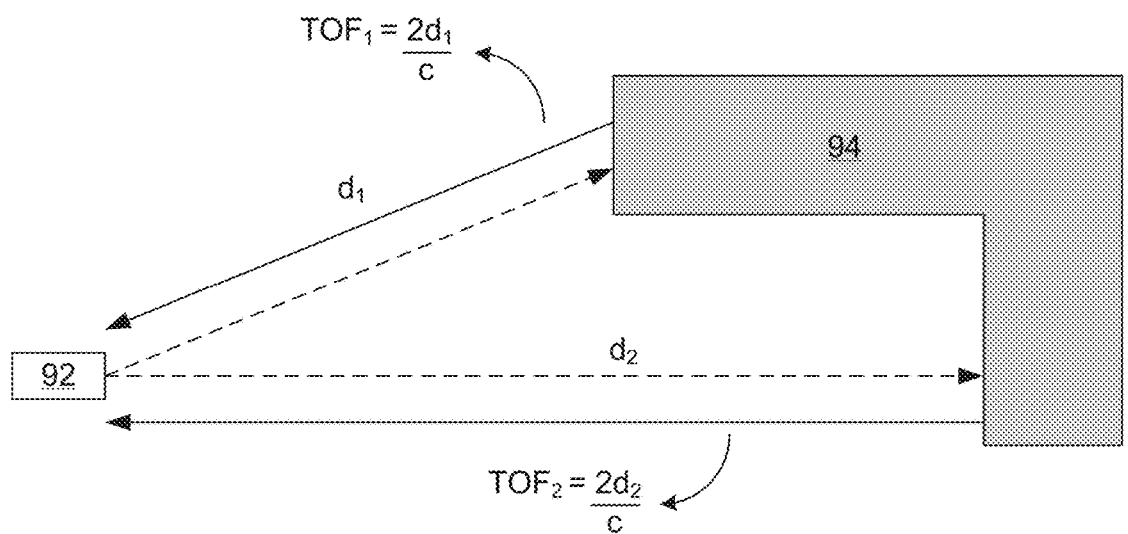
FIG. 9
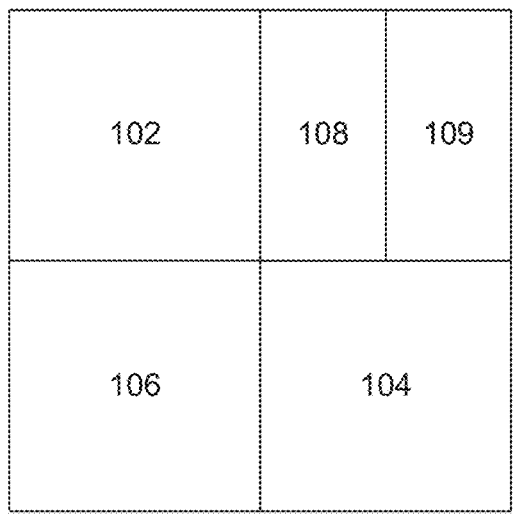     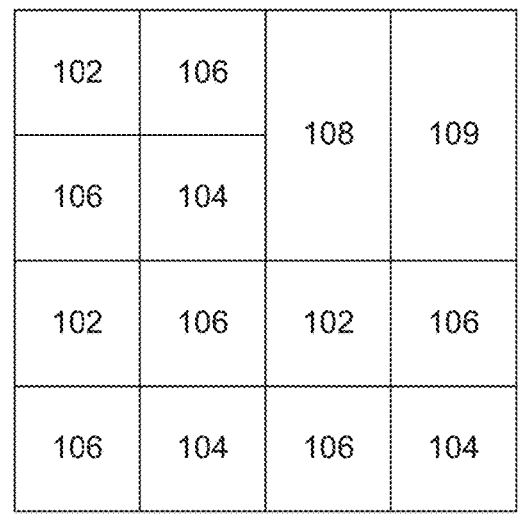
FIG. 10a          FIG. 10b

HIGH SPEED PHOTOSENSITIVE DEVICES AND ASSOCIATED METHODS

PRIORITY DATA

The present application claims priority as a continuation application of U.S. patent application Ser. No. 16/708,335 filed on Dec. 9, 2019, which claims priority as a continuation application of U.S. patent application Ser. No. 15/679,827 filed on Aug. 17, 2017, which claims priority as a continuation application of U.S. patent application Ser. No. 14/580,143 filed on Dec. 22, 2014, which claims priority as a continuation of U.S. patent application Ser. No. 13/164,630, filed on Jun. 20, 2011, which claims the benefit of U.S. Provisional Patent Application No. 61/356,536, filed on Jun. 18, 2010, all of which are incorporated herein by reference.

BACKGROUND

Many imaging applications such as hands-free gesture control, video games, medical, and machine vision, as well as communication applications utilize various optoelectronic devices, such as photodetectors and imaging arrays of photodetectors. Communication applications typically use, for example, fiber optical networks because such networks perform well in the near infrared wavelengths of light where optical fibers experience lower signal loss. Applications for laser marking and range finding commonly use lasers with near infrared wavelengths such 1064 nm. Other applications such as depth perception applications utilize imagers that can detect near infrared wavelengths such as 850 nm or 940 nm. These wavelengths are commonly generated from light emitting diodes or laser diodes made with gallium arsenide (GaAs). All of these applications require detectors or detector arrays with fast response time, typically faster than what can be achieved with a thick (eg >100 um) thick active layer of silicon. Therefore, the silicon devices utilized for these applications are often thin and have specific design considerations included to reduce response time. However, as the active layer of silicon becomes thinner, the response at longer wavelengths (eg 850 nm, 940 nm, and 1064 nm) because much lower than that of a thick silicon device layer. Thick silicon devices with high response at longer wavelengths, on the other hand, have slow response time and are difficult to deplete.

SUMMARY

The present disclosure provides high speed optoelectronic devices and associated methods. In one aspect, for example, a high speed optoelectronic device can include a silicon material having an incident light surface, a first doped region and a second doped region forming a semiconductive junction in the silicon material, and a textured region coupled to the silicon material and positioned to interact with electromagnetic radiation. The optoelectronic device has a response time of from about 1 picosecond to about 5 nanoseconds and a responsivity of greater than or equal to about 0.4 A/W for electromagnetic radiation having at least one wavelength from about 800 nm to about 1200 nm. In another aspect, the optoelectronic device has a responsivity of greater than or equal to about 0.5 A/W for electromagnetic radiation having at least one wavelength from about 800 nm to about 1200 nm. In yet another aspect, the optoelectronic device has a responsivity of greater than or equal to about 0.45 A/W for electromagnetic radiation having a wavelength of about 850 nm. In a further aspect, the silicon material has a thickness of from about 1 µm to about 100 µm. In yet a further aspect, dark current of the device during operation is from about 100 pA/cm$^2$ to about 10 nA/cm$^2$.

In another aspect, a high speed optoelectronic device can include a silicon material having an incident light surface, a first doped region and a second doped region forming a semiconductive junction in the silicon material, and a textured region coupled to the silicon material and positioned to interact with electromagnetic radiation. The optoelectronic device has a response time of from about 1 picosecond to about 5 nanoseconds and a responsivity of greater than or equal to about 0.3 A/W for electromagnetic radiation having a wavelength of about 940 nm.

In yet another aspect, high speed optoelectronic device can include a silicon material having an incident light surface, a first doped region and a second doped region forming a semiconductive junction in the silicon material, and a textured region coupled to the silicon material and positioned to interact with electromagnetic radiation. The optoelectronic device has a response time of from about 1 picosecond to about 5 nanoseconds and a responsivity of greater than or equal to about 0.05 A/W for electromagnetic radiation having a wavelength of about 1060 nm.

In another aspect, a photodiode array can include a silicon material having an incident light surface, at least two photodiodes in the silicon material, each photodiode including a first doped region and a second doped region forming a junction, and a textured region coupled to the silicon material and positioned to interact with electromagnetic radiation. The photodiode array has a response time of from about 1 picosecond to about 5 nanoseconds and a responsivity of greater than or equal to about 0.4 A/W for electromagnetic radiation having at least one wavelength from about 800 nm to about 1200 nm. In one aspect, the silicon material has a thickness of from about 1 µm to about 100 µm.

In yet another aspect, a method of increasing the speed of an optoelectronic device can include doping at least two regions in a silicon material to form at least one junction, and texturing the silicon material to form a textured region positioned to interact with electromagnetic radiation. The optoelectronic device has a response time of from about 1 picosecond to about 5 nanoseconds and a responsivity of greater than or equal to about 0.4 A/W for electromagnetic radiation having at least one wavelength from about 800 nm to about 1200 nm. In one aspect, the device can include a further doped region intended to quickly bring carriers from the side opposite junction to the junction region.

BRIEF DESCRIPTION OF THE DRAWINGS

FIG. 9 is an illustration of a time of flight measurement in accordance with another aspect of the present disclosure;

FIG. 10a is a schematic view of a pixel configuration for a photoimager array in accordance with another aspect of the present disclosure;

FIG. 10b is a schematic view of a pixel configuration for a photoimager array in accordance with another aspect of the present disclosure;

DETAILED DESCRIPTION

Figure 1:
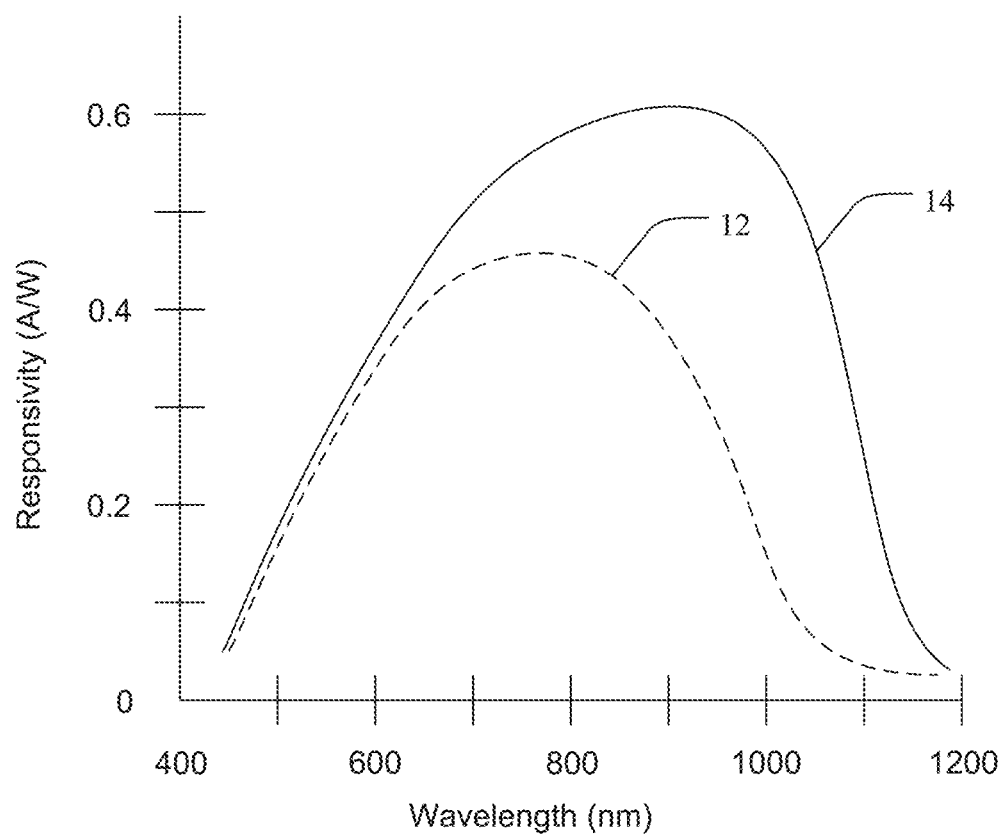
FIG. 1 is a graphical representation of the absorption characteristics of a fast (or thin) photodetector device based on standard silicon compared to the absorption characteristics of a photodetecting device based on silicon but having a textured region in accordance with one aspect of the present disclosure.

Before the present disclosure is described herein, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

Definitions

The following terminology will be used in accordance with the definitions set forth below.

It should be noted that, as used in this specification and the appended claims, the singular forms "a," and, "the" can include plural referents unless the context clearly dictates otherwise. Thus, for example, reference to "a dopant" can include one or more of such dopants and reference to "the layer" can include reference to one or more of such layers.

As used herein, "quantum efficiency" (QE) is defined as the percentage of photons incident on an optoelectronic device that are converted into electrons. External QE (EQE) is defined as the current obtained outside of the device per incoming photon. As such, EQE therefore depends on both the absorption of photons and the collection of charges. The EQE is lower than the QE due to recombination effects and optical losses (e.g. transmission and reflection losses).

As used herein, "responsivity" is a measure of the input-output gain of a detector system. In the case of a photodetector, responsivity is a measure of the electrical output per optical input. Responsivity of a photodetector is expressed in amperes per watt of incident radiant power. Additionally, responsivity is a function of the wavelength of the incident radiation and of the properties of the device, such as the bandgap of the material of which the device is made. One expression for responsivity ($R_\lambda$) is shown in Equation I, where η is the external quantum efficiency of the detector for a given wavelength (λ), q is the charge of an electron, h is Planks constant, and v is the frequency of light.

$$R_\lambda = \frac{q}{hv} \times \eta \approx \frac{\lambda_{(\mu m)}}{1,23985} \times \eta \qquad (I)$$

As used herein, the terms "electromagnetic radiation" and "light" can be used interchangeably, and can represent wavelengths across a broad range, including visible wavelengths (approximately 350 nm to 800 nm) and non-visible wavelengths (longer than about 800 nm or shorter than 350 nm). The infrared spectrum is often described as including a near infrared portion of the spectrum including wavelengths of approximately 800 to 1300 nm, a short wave infrared portion of the spectrum including wavelengths of approximately 1300 nm to 3 micrometers, and a mid to long wave infrared (or thermal infrared) portion of the spectrum including wavelengths greater than about 3 micrometers up to about 30 micrometers. These are generally and collectively referred to herein as "infrared" portions of the electromagnetic spectrum unless otherwise noted.

As used herein, "response time" refers to the rise time or fall time of a detector device. In one aspect, "rise time" is the time difference between the 10% point and the 90% point of the peak amplitude output on the leading edge of the electrical signal generated by the interaction of light with the device. "Fall time" is measured as the time difference between the 90% point and the 10% point of the trailing edge of the electrical signal. In some aspects, fall time can be referred to as the decay time.

As used herein, the terms "disordered surface" and "textured surface" can be used interchangeably, and refer to a surface having a topology with nano- to micron-sized surface variations. Such a surface topology can be formed by the irradiation of a laser pulse or laser pulses, chemical etching, lithographic patterning, interference of multiple simultaneous laser pulses, or reactive ion etching. While the characteristics of such a surface can be variable depending on the materials and techniques employed, in one aspect such a surface can be several hundred nanometers thick and made up of nanocrystallites (e.g. from about 10 to about 50 nanometers) and nanopores. In another aspect, such a surface can include micron-sized structures (e.g. about 1 μm to about 60 μm). In yet another aspect, the surface can include nano-sized and/or micron-sized structures from about 5 nm and about 500 μm.

As used herein, the term "fluence" refers to the amount of energy from a single pulse of laser radiation that passes through a unit area. In other words, "fluence" can be described as the energy density of one laser pulse.

As used herein, the terms "surface modifying" and "surface modification" refer to the altering of a surface of a semiconductor material using laser irradiation, chemical etching, reactive ion etching, lithographic patterning, etc. In one specific aspect, surface modification can include processes using primarily laser radiation or laser radiation in combination with a dopant, whereby the laser radiation facilitates the incorporation of the dopant into a surface of the semiconductor material. Accordingly, in one aspect surface modification includes doping of a semiconductor material.

As used herein, the term "target region" refers to an area of a semiconductor material that is intended to be doped or surface modified. The target region of a semiconductor material can vary as the surface modifying process progresses. For example, after a first target region is doped or surface modified, a second target region may be selected on the same semiconductor material.

As used herein, the term "detection" refers to the sensing, absorption, and/or collection of electromagnetic radiation.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

The Disclosure Many applications for optoelectronic devices can benefit from high speed operation. For example, a photodetector used in applications such as communicating data, laser range finding, laser marking, time of flight imaging, and the like, can be a limiting factor in how fast data can be transmitted. Thus, a photodetector having a faster responsivity can receive data at a correspondingly higher rate. The speed of many optoelectronic devices such as photodetectors is dependent, at least in part, on the speed with which charge carriers are swept from the photodetector. The speed at which carriers are swept from a photodetector can depend on the distance a carrier has to travel, whether the carriers are generated in a region of the device with an electric field, and the likelihood of a carrier being trapped or slowed in a defect within the device layer. In some cases, a bias can be applied to the photodetector to decrease the response time by increasing the drift velocity of the carriers. Additionally, many traditional data communication applications utilize electromagnetic radiation in the red and infrared spectrum as a data carrier. In a typical silicon device, electromagnetic radiation in the red and infrared spectrum generate carriers deep into the silicon device, thus increasing the distance the carrier has to travel to be collected. Thus it can be beneficial for a photodetector to absorb infrared radiation in a thin device in order to increase communication speeds and to reduce dark current.

Silicon is one material that can be used as a photodetector semiconductor. Thin silicon photodetectors are limited, however, in their ability to detect infrared wavelengths, particularly when functioning at higher data communication speeds. Traditional silicon materials require substantial absorption depths to detect photons having wavelengths longer than about 700 nm. While visible light can be absorbed at relatively shallow depths in silicon, absorption of longer wavelengths (e.g. 900 nm) in silicon of a thin wafer depth (e.g. approximately 100 µm) is poor if at all. Because short wave infrared light is mostly transparent to silicon-based photodetectors, other materials (e.g. InGaAs) have traditionally been used to detect infrared electromagnetic radiation having wavelengths greater than about 1100 nm. Using such other materials, however, is expensive, increases dark current relative to silicon devices, and limits the detection of electromagnetic radiation in the visible spectrum (i.e. visible light, 350 nm-800 nm). As such, silicon is often used because it is relatively cheap to manufacture and can be used to detect wavelengths in the visible spectrum.

Accordingly, the present disclosure provides optoelectronic devices and associated methods that increase the electromagnetic radiation absorption range of thin silicon devices into the infrared region, thus allowing the absorption of visible and infrared light by such devices. Additionally, such devices can be configured to operate at much higher data rates and have increased external quantum efficiencies and responsivities as compared to traditional thin silicon devices operating in the infrared spectrum. In one aspect, for example, a silicon photodetector is provided that includes a textured region to increase the absorption, external quantum efficiency, and to decrease response times in the infrared wavelengths. Such unique and novel devices can operate at high data rates in the visible and infrared spectrums. Such an increased sensitivity in a silicon-based device can thus reduce processing cost of photodetectors, reduce the power needed in light sources, increase the depth resolution in 3D types imaging, increase the distance over which data can be transmitted, improve laser range finding, and increases opportunities to use longer wavelengths of electromagnetic radiation for communicating data.

In one aspect, for example, a high speed optoelectronic device is provided. Such a device can include a silicon material having an incident light surface, a first doped region and a second doped region forming a semiconductive junction in the silicon material, and a textured region coupled to the silicon material and positioned to interact with electromagnetic radiation. The optoelectronic device has a response time of from about 1 picosecond to about 5 nanoseconds and a responsivity of greater than or equal to about 0.4 A/W for electromagnetic radiation having at least one wavelength from about 800 nm to about 1200 nm. For example, FIG. 1 shows an absorption/responsivity graph where the dashed line 12 represents the absorption characteristics of a photodetector device based on standard fast silicon device and the solid line 14 represents the absorption characteristics of a photodetecting device based on silicon but having a textured region. Notably, the absorption of a standard fast silicon photodiode in the infrared, i.e. the 800 nm to 1200 nm region, results in relatively low responsivity.

Additionally, in one aspect the response time of the optoelectronic device is from about 1 picosecond to about 1 nanosecond. In another aspect, the response time of the optoelectronic device is from about 1 picosecond to about 500 picoseconds.

In another aspect, the optoelectronic device has a responsivity of greater than or equal to about 0.5 A/W for electromagnetic radiation having at least one wavelength from about 800 nm to about 1200 nm. In yet another aspect, the optoelectronic device has a responsivity of greater than or equal to about 0.45 A/W for electromagnetic radiation having a wavelength of about 850 nm. In a further aspect, the optoelectronic device has a responsivity of greater than or equal to about 0.3 A/W for electromagnetic radiation having a wavelength of about 940 nm. In yet a further aspect, the optoelectronic device has a responsivity of greater than or equal to about 0.05 A/W for electromagnetic radiation having a wavelength of about 1060 nm.

In some aspects, the thickness of the device can dictate the responsivity and response time. However standard silicon devices need to be thick, i.e. greater than 100 μm in order to detect wavelengths in the infrared spectrum, and such detection with thick devices results in a slow response and high dark current. It has now been discovered that a textured region positioned to interact with electromagnetic radiation can increase the absorption of infrared light in a device, thereby improving the infrared responsivity while allowing for fast operation. Diffuse scattering and reflection can result in increased path lengths for absorption, particularly if combined with total internal reflection, resulting in large improvements of responsivity in the infrared for silicon photodiodes, photodetectors, photodiode arrays, and the like. Because of the increased path lengths for absorption, thinner silicon materials can be used to absorb electromagnetic radiation up into the infrared regions. One advantage of thinner silicon material devices is that charge carriers are more quickly swept from the device, thus decreasing the response time. Conversely, thick silicon material devices sweep charge carriers therefrom more slowly, at least in part due to diffusion.

Thus, the devices of the present disclosure increase the absorption path length of silicon materials by increasing the absorption path length for longer wavelengths as compared to traditional silicon devices. The absorption depth in silicon photodetectors is the depth into silicon at which the radiation intensity is reduced to about 36% of the value at the surface of the silicon material. The increased absorption path length results in an apparent reduction in the absorption depth, or a reduced apparent or effective absorption depth. For example, the effective absorption depth of silicon can be reduced such that longer wavelengths can be absorbed at depths of less than or equal to about 100 μm. By increasing the absorption path length, such devices are able to absorb longer wavelengths (e.g. >1000 nm for silicon) within a thin semiconductor material. In addition to decreasing the effective absorption depth, the response time can be decreased using thinner semiconductor materials.

Accordingly, optoelectronic devices according to aspects of the present disclosure provide, among other things, enhanced response in the infrared light portion of the optical spectrum and improved response and quantum efficiency in converting electromagnetic radiation to electrical signals. As such, high quantum efficiencies and high speeds can be obtained in the infrared for devices thinner than about 100 μm. In other words, the response is higher than that found in thicker devices at infrared wavelengths.

Figure 2:
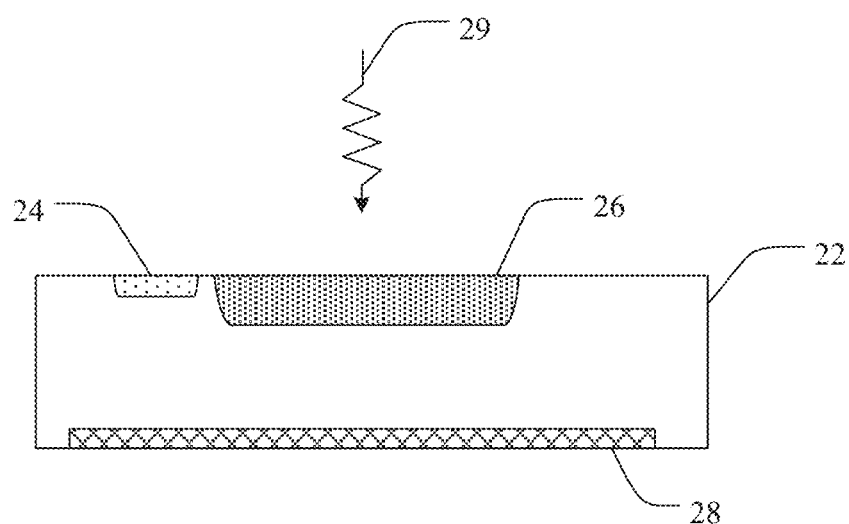
FIG. 2 is a schematic view of a photosensitive device in accordance with another aspect of the present disclosure.

In one aspect, as is shown in FIG. 2 for example, an optoelectronic device can include a silicon material 22 having a first doped region 24 and a second doped region 26 associated therewith. The first and second doped regions thus form a semiconductive junction. Numerous configurations are contemplated, and any type of junction configuration is considered to be within the present scope. For example, the first and second doped regions can be distinct from one another, contacting one another, overlapping one another, etc. In some cases, an intrinsic region can be located at least partially between the first and second doped regions.

The optoelectronic device can also include a textured region 28 coupled to the silicon material 22 and positioned to interact with incoming electromagnetic radiation 29. In this case, the textured region is located on a side of the silicon material that is opposite to the first doped region 24 and the second doped region 26. Electromagnetic radiation that passes through the silicon material to contact the textured region can be reflected back through the silicon material, thus effectively increasing the absorption path length of the silicon material. The textured region can be associated with an entire surface of the silicon material or only a portion thereof. Additionally, in some aspects the textured region can be specifically positioned to maximize the absorption path length of the silicon material. In other aspects, a third doping can be included near the textured region to improve the collection of carriers generated near the textured region.

The silicon material can be of any thickness that allows electromagnetic radiation detection and conversion functionality, and thus any such thickness of silicon material is considered to be within the present scope. Although any thickness of the silicon material is considered to be within the present scope, thin silicon layer materials can be particularly beneficial in decreasing the response time and/or the capacitance of the device. As has been described, charge carriers can be more quickly swept from thinner silicon material layers as compared to thicker silicon material layers. The thinner the silicon, the less material the electron/holes have to traverse in order to be collected, and the lower the probability of a generated charge carrier encountering a defect that could trap or slow the collection of the carrier. Thus one objective to implementing a fast photo response is to utilize a thin silicon material for the body region of the photodiode. Such a device can be nearly depleted of charge carriers by the built in potential of the photodiode and any applied bias to provide for a fast collection of the photo generated carriers by drift in an electric field. Charge carriers remaining in any undepleted region of the photodiode are collected by diffusion transport, which is slower than drift transport. For this reason, it is desirable to have the thickness of any region where diffusion may dominate to be much thinner than the depleted drift regions. In silicon materials having the proper doping provides a depletion region of about 10 μm with no applied bias. As such, in some aspects it can be useful to utilize a silicon material layer having a thickness less of less than about 100 μm, or less than about 10 μm. In another aspect, the silicon material can have a thickness and substrate doping concentration such that an applied bias generates an electrical field sufficient for saturation velocity of the charge carriers. It should be noted that operating a photodiode, as disclosed herein, at a zero bias can result in low noise but at a longer response time. When bias is applied however, the dark current is increased, resulting in higher noise, but with a decreased response time. The increased dark current can be compensated if the incident radiation signal is strong. The amount of dark current increase can be minimized, however, with a thinner device layer.

Accordingly, in one aspect the silicon material has a thickness of from about 1 μm to about 100 μm. In another aspect, the silicon material has a thickness of from about 1 μm to about 50 μm. In yet another aspect, the silicon material has a thickness of from about 5 μm to about 10 μm. In a further aspect, the silicon material has a thickness of from about 1 μm to about 5 μm.

As has been described, the response time of an optoelectronic device is limited by the transit time of the photo generated carriers across the thickness of the substrate. The RC time constant of the load resistance, (R) and the capacitance (C) of the entire electronic device structure can be kept less than this transit time value by using small load resistors and keeping the capacitance of the photodiodes small by limiting the doping density of the silicon material and area of the photodiodes. For example, photodiodes doped at $10^{15}/cm^3$ can have a capacitance that may be 10 nF/cm² without any applied bias. Small area photodiodes with 50 ohm load resistors can have very fast RC time constants. A photodiode with an area of 0.01 cm² can have a RC time constant of 0.5 nanoseconds. Given that the response time will be limited by the maximum charge carrier transit time across the photodiode, then diffusion rates can place an upper limit on the response time for photodiodes of different thickness. For example, if the photodiodes have a thickness of less than d=100 μm, then the diffusion transit time can be calculated by Equation (II) below, where D is the diffusion coefficient for electrons.

$$\frac{d^2}{2D} \quad \text{(II)}$$

The response time is bound by an upper limit of 2 μs. For light having a wavelength of about 900 nm, only about 35% is absorbed in the first pass or a device thinner than 100 μm and approximately 30% is reflected at the first surface, thereby giving a responsivity on the order 10% or 0.1 A/W. The responsivity, R, can be increased at least five fold by using multiple internal reflections to achieve a value of R=0.5 A/W.

In one aspect, a photodiode can have a thickness of less than about d=10 μm. Using equation (I) above, the resultant upper response time limit is about 20 ns. For light having a wavelength of about 700 nm with about 33% absorbed in the first pass and about 30% being reflected at the first surface, the responsivity can be on the order 10% or 0.3 Ampere/Watt. The responsivity, R, can be increased at least two fold by using multiple internal reflections as described herein to achieve a value of R=0.6 A/W.

In one aspect, for example, an optoelectronic device has a response time of from about 100 picoseconds to about 1 nanosecond. In another aspect, an optoelectronic device has a responsivity of from about 0.4 A/W to about 0.55 A/W for at least one wavelength of from about 800 nm to about 1200 nm relative to standard silicon. In yet another aspect, an optoelectronic device has a responsivity of from about 0.1 A/W to about 0.55 A/W for at least one wavelength of from about 1000 nm to about 1200 nm relative to standard silicon. In another aspect, the optoelectronic device has an increased external quantum efficiency of at least 10% for at least one wavelength of from about 550 nm to about 1200 nm relative to a silicon device with comparable thickness and response time. In yet another aspect, an optoelectronic device has a data rate greater than or equal to about 1 Gbs. In a further aspect, an optoelectronic device has a data rate greater than or equal to about 2 Gbs.

As has been described, optoelectronic devices according to aspects of the present disclosure can exhibit lower levels of dark current as compared to traditional devices. Although a variety of reasons are possible, one exemplary reason may be that a thinner silicon material layer can have fewer crystalline defects responsible for the generation of dark current. In one aspect, for example, the dark current of an optoelectronic device during operation is from about 100 pA/cm² to about 10 nA/cm². In another aspect, the maximum dark current of an optoelectronic device during operation is less than about 1 nA/cm².

Various types of silicon materials are contemplated, and any such material that can be incorporated into an optoelectronic device is considered to be within the present scope. In one aspect, for example, the silicon material is monocrystalline. In another aspect, the silicon material is multicrystalline. In yet another aspect, the silicon material is microcrystalline.

The silicon materials of the present disclosure can also be made using a variety of manufacturing processes. In some cases the manufacturing procedures can affect the efficiency of the device, and may be taken into account in achieving a desired result. Exemplary manufacturing processes can include Czochralski (Cz) processes, magnetic Czochralski (mCz) processes, Float Zone (FZ) processes, epitaxial growth or deposition processes, and the like. In one aspect, the silicon material is epitaxially grown.

As has been described, the textured region can function to diffuse electromagnetic radiation, to redirect electromagnetic radiation, and to absorb electromagnetic radiation, thus increasing the QE of the device. The textured region can include surface features to increase the effective absorption length of the silicon material. The surface features can be cones, pyramids, pillars, protrusions, microlenses, quantum dots, inverted features and the like. Factors such as manipulating the feature sizes, dimensions, material type, dopant profiles, texture location, etc. can allow the diffusing region to be tunable for a specific wavelength. In one aspect, tuning the device can allow specific wavelengths or ranges of wavelengths to be absorbed. In another aspect, tuning the device can allow specific wavelengths or ranges of wavelengths to be reduced or eliminated via filtering.

As has been described, a textured region according to aspects of the present disclosure can allow a silicon material to experience multiple passes of incident electromagnetic radiation within the device, particularly at longer wavelengths (i.e. infrared). Such internal reflection increases the effective absorption length to be greater than the thickness of the semiconductor substrate. This increase in absorption length increases the quantum efficiency of the device, leading to an improved signal to noise ratio. The textured region can be associated with the surface nearest the impinging electromagnetic radiation, or the textured region can be associated with a surface opposite in relation to impinging electromagnetic radiation, thereby allowing the radiation to pass through the silicon material before it hits the textured region. Additionally, the textured region can be doped. In one aspect, the textured region can be doped to the same or similar doping polarity as the silicon substrate so as to provide a doped contact region on the backside of the device.

The textured region can be formed by various techniques, including lasing, chemical etching (e.g. anisotropic etching, isotropic etching), nanoimprinting, additional material deposition, reactive ion etching, and the like. One effective method of producing a textured region is through laser processing. Such laser processing allows discrete locations of the semiconductor substrate to be textured. A variety of techniques of laser processing to form a textured region are contemplated, and any technique capable of forming such a region should be considered to be within the present scope. Laser treatment or processing can allow, among other things, enhanced absorption properties and thus increased electromagnetic radiation focusing and detection.

In one aspect, for example, a target region of the silicon material can be irradiated with laser radiation to form a textured region. Examples of such processing have been described in further detail in U.S. Pat. Nos. 7,057,256, 7,354,792 and 7,442,629, which are incorporated herein by reference in their entireties. Briefly, a surface of a silicon material is irradiated with laser radiation to form a textured or surface modified region. Such laser processing can occur with or without a dopant material. In those aspects whereby a dopant is used, the laser can be directed through a dopant carrier and onto the silicon surface. In this way, dopant from the dopant carrier is introduced into the target region of the silicon material. Such a region incorporated into a silicon material can have various benefits in accordance with aspects of the present disclosure. For example, the target region typically has a textured surface that increases the surface area of the laser treated region and increases the probability of radiation absorption via the mechanisms described herein. In one aspect, such a target region is a substantially textured surface including micron-sized and/or nano-sized surface features that have been generated by the laser texturing. In another aspect, irradiating the surface of the silicon material includes exposing the laser radiation to a dopant such that irradiation incorporates the dopant into the semiconductor. Various dopant materials are known in the art, and are discussed in more detail herein. It is also understood that in some aspects such laser processing can occur in an environment that does not substantially dope the silicon material (e.g. an argon atmosphere).

Thus the surface of the silicon material that forms the textured region is chemically and/or structurally altered by the laser treatment, which may, in some aspects, result in the formation of surface features appearing as nanostructures, microstructures, and/or patterned areas on the surface and, if a dopant is used, the incorporation of such dopants into the semiconductor material. In some aspects, such features can be on the order of 50 nm to 20 μm in size and can assist in the absorption of electromagnetic radiation. In other words, the textured surface can increase the probability of incident radiation being absorbed by the silicon material.

The type of laser radiation used to surface modify a silicon material can vary depending on the material and the intended modification. Any laser radiation known in the art can be used with the devices and methods of the present disclosure. There are a number of laser characteristics, however, that can affect the surface modification process and/or the resulting product including, but not limited to, wavelength of the laser radiation, pulse width, pulse fluence, pulse frequency, polarization, laser propagation direction relative to the silicon material, etc. In one aspect, a laser can be configured to provide pulsatile lasing of a silicon material. A short-pulsed laser is one capable of producing femtosecond, picosecond and/or nanosecond pulse durations. Laser pulses can have a central wavelength in a range of about from about 10 nm to about 12 μm, and more specifically from about 200 nm to about 1600 nm. The pulse width of the laser radiation can be in a range of from about tens of femtoseconds to about hundreds of nanoseconds. In one aspect, laser pulse widths can be in the range of from about 50 femtoseconds to about 50 picoseconds. In another aspect, laser pulse widths can be in the range of from about 50 picoseconds to 100 nanoseconds. In another aspect, laser pulse widths are in the range of from about 50 to 500 femtoseconds.

The number of laser pulses irradiating a target region can be in a range of from about 1 to about 5000. In one aspect, the number of laser pulses irradiating a target region can be from about 2 to about 1000. Further, the repetition rate or frequency of the pulses can be selected to be in a range of from about 10 Hz to about 10 MHz, or in a range of from about 1 kHz to about 1 MHz, or in a range from about 10 Hz to about 10 kHz. Moreover, the fluence of each laser pulse can be in a range of from about 1 kJ/m$^2$ to about 20 kJ/m$^2$, or in a range of from about 3 kJ/m$^2$ to about 8 kJ/m$^2$.

A variety of dopants are contemplated, and any such material that can be used in doping the first doped region, the second doped region, the textured region, or any other doped portion of the optoelectronic device is considered to be within the present scope. It should be noted that the particular dopant utilized can vary depending on the silicon material being laser treated, as well as the intended uses of the resulting silicon material. A dopant can be either electron donating or hole donating. In one aspect, non-limiting examples of dopants can include S, F, B, P, N, As, Se, Te, Ge, Ar, Ga, In, Sb, and combinations thereof. It should be noted that the scope of dopants should include, not only the dopants themselves, but also materials in forms that deliver such dopants (i.e. dopant carriers). For example, S dopants includes not only S, but also any material capable being used to dope S into the target region, such as, for example, $H_2S$, $SF_6$, $SO_2$, and the like, including combinations thereof. In one specific aspect, the dopant can be S. Sulfur can be present at an ion dosage level of between about $5\times10^{14}$ and about $1\times10^{16}$ ions/cm$^2$. Non-limiting examples of fluorine-containing compounds can include $ClF_3$, $PF_5$, $F_2SF_6$, $BF_3$, $GeF_4$, $WF_6$, $SiF_4$, HF, $CF_4$, $CHF_3$, $CH_2F_2$, $CH_3F$, $C_2F_6$, $C_2HF_5$, $C_3F_8$, $C_4F_8$, $NF_3$, and the like, including combinations thereof. Non-limiting examples of boron-containing compounds can include $B(CH_3)_3$, $BF_3$, $BCl_3$, BN, $C_2B_{10}H_{12}$, borosilica, $B_2H_6$, and the like, including combinations thereof. Non-limiting examples of phosphorous-containing compounds can include $PF_5$, $PH_3$, and the like, including combinations thereof. Non-limiting examples of chlorine-containing compounds can include $Cl_2$, $SiH_2Cl_2$, HCl, $SiCl_4$, and the like, including combinations thereof. Dopants can also include arsenic-containing compounds such as $AsH_3$ and the like, as well as antimony-containing compounds. Additionally, dopant materials can include mixtures or combinations across dopant groups, i.e. a sulfur-containing compound mixed with a chlorine-containing compound. In one aspect, the dopant material can have a density that is greater than air. In one specific aspect, the dopant material can include Se, $H_2S$, $SF_6$, or mixtures thereof. In yet another specific aspect, the dopant can be $SF_6$ and can have a predetermined concentration range of about $5.0 \times 10^{-8}$ mol/cm$^3$ to about $5.0 \times 10^4$ mol/cm$^3$. $SF_6$ gas is a good carrier for the incorporation of sulfur into the semiconductor material via a laser process without significant adverse effects on the silicon material. Additionally, it is noted that dopants can also be liquid solutions of n-type or p-type dopant materials dissolved in a solution such as water, alcohol, or an acid or basic solution. Dopants can also be solid materials applied as a powder or as a suspension dried onto the wafer.

Accordingly, the first doped region and the second doped region can be doped with an electron donating or hole donating species to cause the regions to become more positive or negative in polarity as compared to each other and/or the silicon substrate. In one aspect, for example, either doped region can be p-doped. In another aspect, either doped region can be n-doped. In one aspect, for example, the first doped region can be negative in polarity and the second doped region can be positive in polarity by doping with p+ and n− dopants. In some aspects, variations of n(−−), n(−), n(+), n(++), p(−−), p(−), p(+), or p(++) type doping of the regions can be used. Additionally, in some aspects the silicon material can be doped in addition to the first and second doped regions. The silicon material can be doped to have a doping polarity that is different from one or more of the first and second doped regions, of the silicon material can be doped to have a doping polarity that is the same as one or more of the first and second doped regions. In one specific aspect, the silicon material can be doped to be p-type and one or more of the first and second doped regions can be n-type. In another specific aspect, the silicon material can be doped to be n-type and one or more of the first and second doped regions can be p-type. In one aspect, at least one of the first or second doped regions has a surface area of from about 0.1 μm$^2$ to about 32 μm$^2$.

Figure 3:
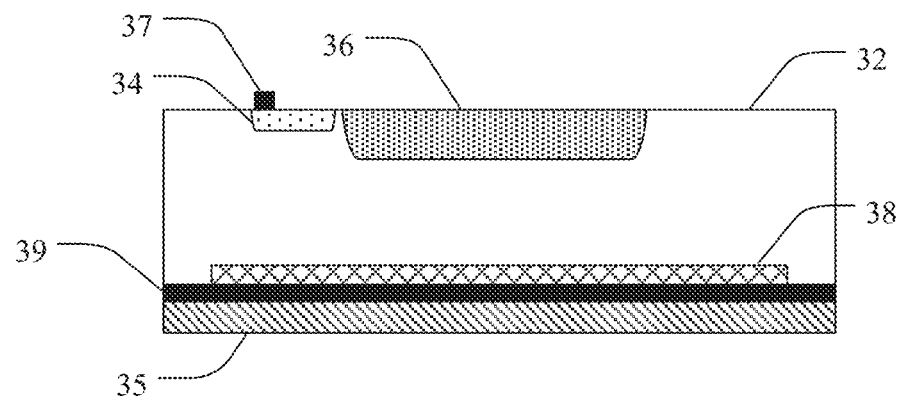
FIG. 3 is a schematic view of a photosensitive device in accordance with yet another aspect of the present disclosure.

In another aspect, at least a portion of the textured region and/or the silicon material can be doped with a dopant to generate a back surface field. A back surface field can function to repel generated charge carriers from the backside of the device and toward the junction to improve collection efficiency and speed. The addition of a back surface field can increase charge carrier collection and depletion. The presence of a back surface field also acts to suppress dark current contribution from the surface of a device. In another aspect, as is shown in FIG. 3, an optoelectronic device can include a silicon material 32 having a first doped region 34 and a second doped region 36 associated therewith, where the first and second doped regions form a semiconductive photodiode junction. A textured region 38 is coupled to the silicon material, and is positioned to interact with electromagnetic radiation. The optoelectronic device can also include a first contact 37 to provide electrical contact to one side of the device, and a second contact 39 to provide electrical contact with the other side of the device. In one aspect, the first contact and the second contact are opposite in voltage polarity from one another. Note that in some aspects, the first and second contacts can be on the same side of the device (not shown). Additionally, a support substrate 35 can be coupled to the device in order to provide structural stability thereto. In one aspect, the one of the contacts can be a doped portion of the textured region. Either a portion of the textured region or the entire textured region can be doped to create one of the contacts.

While the optoelectronic devices according to aspects of the present disclosure can operate in the absence of a bias at high speeds, in one aspect a reverse bias is applied across the first and second contacts. Such a reverse bias can function to decrease the response time of the device by more quickly sweeping charge carriers from the silicon material. Accordingly, for those situations whereby a bias is used, any bias voltage capable of sweeping charge carriers from the silicon material is considered to be within the present scope. In one aspect, for example, the reverse bias is from about 0.001 V to about 20 V. In another aspect, the reverse bias is from about 0.001 V to about 10 V. In yet another aspect, the reverse bias is from about 0.001 V to about 5 V. In a further aspect, the reverse bias is from about 0.001 V to about 3 V. In yet a further aspect, the reverse bias is from about 3 V to about 5 V. In some aspects, the reverse bias can be absent, or in other words, 0 V is applied across the first and second contacts. In such cases, the charge carriers can be depleted from the silicon material by the junction potential created by the first and second doped regions.

Figure 4:
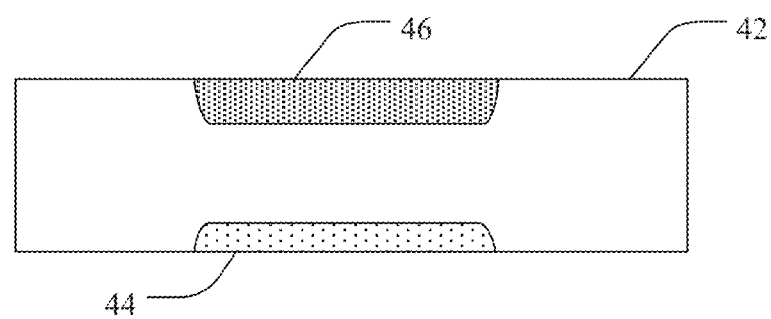
FIG. 4 is a schematic view of a photosensitive device in accordance with a further aspect of the present disclosure.
Figure 5:
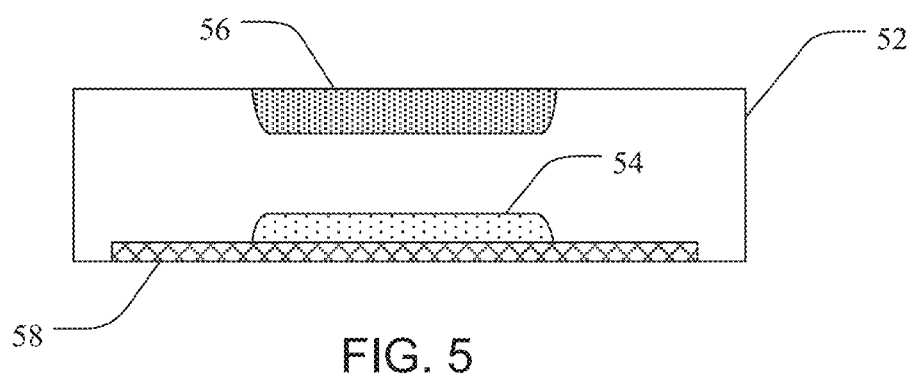
FIG. 5 is a schematic view of a photosensitive device in accordance with yet a further aspect of the present disclosure.

In some aspects, the first and second doped regions can be on opposite sides of the silicon material. As is shown in FIG. 4, for example, a silicon material 42 can include a first doped region 44 associated with one surface of the silicon material and a second doped region 46 associated with the opposite side of the silicon material. Furthermore, the textured region can be associated with either doped region. As is shown in FIG. 5, for example, a silicon material 52 can include a first doped region 54 associated with one surface of the silicon material and a second doped region 56 associated with the opposite side of the silicon material, where a textured region 58 is associated with the first doped region. In another aspect, the textured region is associated with the second doped region (not shown). In a further aspect, a textured region can be associated with each doped region (not shown).

Figure 6:
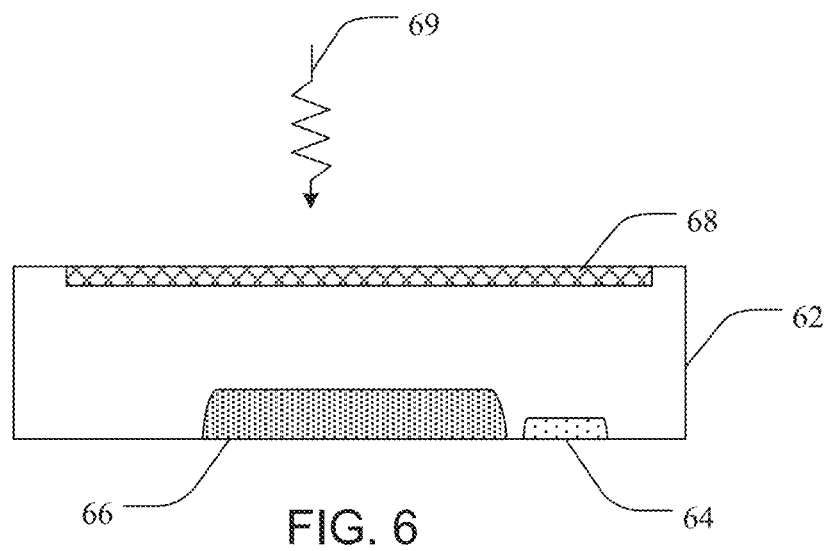
FIG. 6 is a schematic view of a photosensitive device in accordance with another aspect of the present disclosure.
Figure 7:
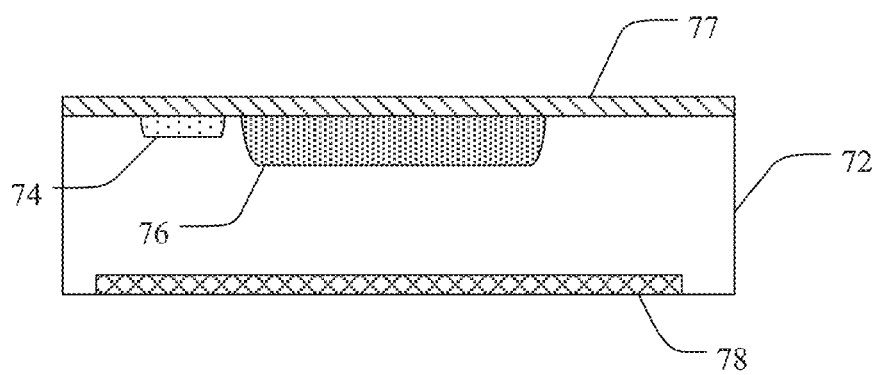
FIG. 7 is a schematic view of a photosensitive device in accordance with yet another aspect of the present disclosure.

In another aspect, as is shown in FIG. 6, a silicon material 62 can have a first doped region 64 and a second dope region 66 on one surface, and a textured region 68 on an opposing surface. In this case, electromagnetic radiation 69 is incident on the side of the silicon material having the textured surface. In another aspect, as is shown in FIG. 7, a silicon material 72 can have a first doped region 74 and a second doped region 76 on an opposing surface to a textured region 78. An antireflective layer 77 can be coupled to the silicon material on the opposite surface to the textured layer. In some aspects, the antireflective layer can be on the same side of the silicon material as the textured region (not shown). Furthermore, in some aspects a lens can be optically coupled to the silicon material and positioned to focus incident electromagnetic radiation into the silicon material.

In another aspect of the present disclosure, a photodiode array is provided. Such an array can include a silicon material having an incident light surface, at least two photodiodes in the silicon material, where each photodiode includes a first doped region and a second doped region forming a junction, and a textured region coupled to the silicon material and positioned to interact with electromagnetic radiation. The textured region can be a single textured region or multiple textured regions. Additionally, the photodiode array has a response time of from about 1 picosecond to about 5 nanoseconds and a responsivity of greater than or equal to about 0.4 A/W for electromagnetic radiation having at least one wavelength from about 800 nm to about 1200 nm.

Figure 8:
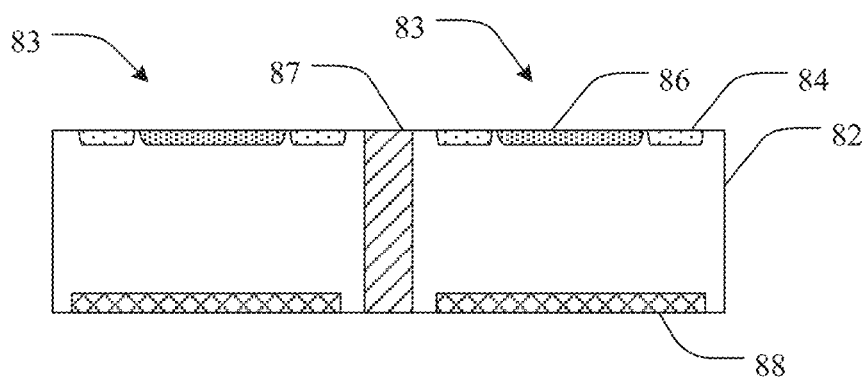
FIG. 8 is a schematic view of a photosensitive array device in accordance with a further aspect of the present disclosure.

As is shown in FIG. 8, for example, a silicon material 88 can include at least two photodiodes 83 each having a first doped region 84 and a second doped region 86. A textured region 88 is positioned to interact with electromagnetic radiation. FIG. 8 shows a separate textured region for each photodiode. In some aspects, a single textured region can be used to increase the absorption path lengths of multiple photodiodes in the array.

Furthermore, an isolation structure 57 can be positioned between the photodiodes to electrically and/or optically isolate the photodiodes from one another. In another aspect, the photodiode array can be electronically coupled to electronic circuitry to process the signals generated by each photodiode.

Various types of isolation structures are contemplated, and any such isolation is considered to be within the present scope. The isolation structure can be shallow or deep trench isolation. Furthermore, the isolation structure can include depths between traditional shallow and deep isolation, depending on the device design. Isolation structures can include dielectric materials, reflective materials, conductive materials, and combinations thereof, including textured regions and other light diffusing features. Thus the isolation structure can be configured to reflect incident electromagnetic radiation, in some cases until it is absorbed, thereby increasing the effective absorption length of the device.

Photodiode arrays can have a variety of uses. For example, in one aspect such an array can be an imager. Numerous types of imagers are contemplated, and any such imager or imaging application is considered to be within the present scope. Non-limiting examples include 3D imaging, machine vision, night vision, security and surveillance, various commercial applications, laser range finding and marking, and the like. Thus, in the case of 3D imaging for example, the array is operable to detect a phase delay between a reflected and an emitted optical signal.

As one example, various applications can benefit from depth information, such as hands-free gesture control, video games, medical applications, machine vision, etc. Time-of-flight (TOF) is a technique developed for use in radar and LIDAR (Light Detection and Ranging) systems to provide depth information. The basic principle of TOF involves sending a signal and measuring a property of the returned signal from a target. The measured property is used to determine the TOF. Distance to the target is therefore derived by multiplication of half the TOF and the velocity of the signal.

FIG. 9 illustrates a time of flight measurement with a target having multiple surfaces that are separated spatially. Equation (III) can be used to measure the distance to a target where d is the distance to the target and c is the speed of light.

$$d = \frac{TOF * c}{2} \quad \text{(III)}$$

By measuring the time (e.g. TOF) it takes for light to be emitted from a light source 92, travel to and from a target 94, the distance between the light source (e.g. a light emitting diode (LED)) and the surface of the target can be derived. For an imager, if each pixel can perform the above TOF measurement, a 3D image of the target can be achieved. The distance measurements become difficult with TOF methods when the target is relatively near the source due to the high speed of light. In one aspect, therefore, a TOF measurement can utilize a modulated LED light pulse and measure the phase delay between emitted light and received light. Based on the phase delay and the LED pulse width, the TOF can be derived.

TOF concept has been utilized in both CMOS and CCD sensor to obtain depth information from each pixel. In many traditional 3D TOF sensors, an infrared LED or laser emits a modulated light pulse to illuminate a target. The measured phase shift between emitted and received light can be used to derive the depth information. Such methods, however, can have various problematic issues. For example, ambiguity (e.g. aliasing) occurs if the TOF difference between two targets is equal to half period of light source modulation frequency. To solve the ambiguity issue, an often used approach is to measure the same scene with multiple modulation frequencies. In addition, due to the use of near infrared LED or laser, a good color image normally cannot be achieved by the same 3D TOF sensor since an infrared (IR) cut filter cannot be used. Further, many current 3D TOF sensors operate in a rolling shutter mode. In rolling shutter mode an image is captured by scanning across the frame either vertically or horizontally. Motion artifacts are known to accompany cameras that use the rolling shutter mode and can severely degrade the quality of the depth map. Another issue occurs when ambient light creates an un-wanted offset in the signal output. The photon-shot noise related to the signal offset will degrade the signal-to-noise (SNR) ratio of the useful signal related to modulated near infrared (NIR) light emitting diode (LED). Therefore, many current 3D TOF imagers cannot operate outdoors (e.g. bright ambient light). In addition to the ambient light, any dark current will also contribute to the un-wanted offset, which is same as normal visible pixel.

Figures 10C, 11:
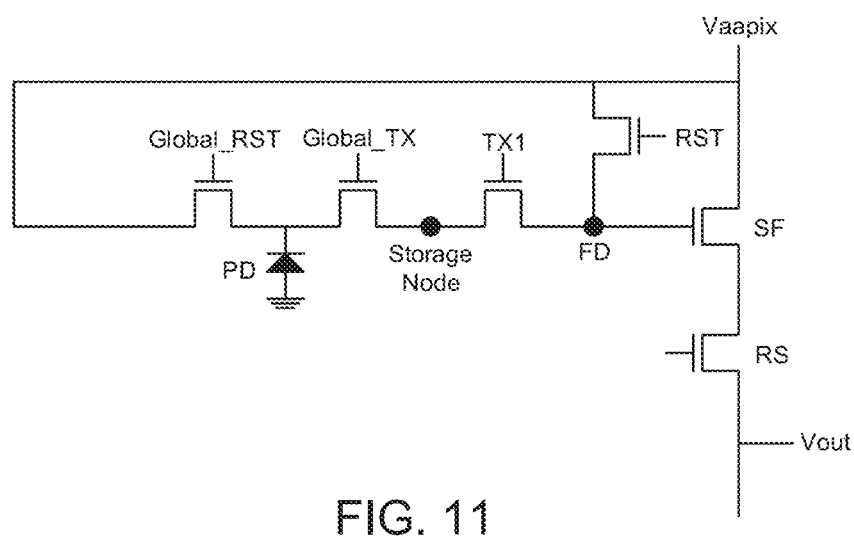
FIG. 10c is a schematic view of a pixel configuration for a photoimager array in accordance with another aspect of the present disclosure.
FIG. 11 is a schematic diagram of a six transistor imager in accordance with another aspect of the present disclosure.

As one example, a 3D pixel, such as a TOF 3D pixel with enhanced infrared response can improve depth accuracy. In one aspect, a photoimager array can include at least one 3D infrared detecting pixel and at least one visible light detecting pixel arranged monolithically in relation to each other. FIGS. 10*a-c* show non-limiting example configurations of pixel arrangements of such arrays. FIG. 10*a* shows one example of a pixel array arrangement having a red pixel 102, a blue pixel 104, and a green pixel 106. Additionally, two 3D TOF pixels (108 and 109) having enhanced responsivity or detectability in the infrared regions of the light spectrum are included. The combination of two 3D pixels allows for better depth perception. In FIG. 10*b*, the pixel arrangement shown includes an imager as described in FIG. 10*a* and three arrays of a red pixel, a blue pixel, and two green pixels. Essentially, one TOF pixel (108 and 109) replaces one quadrant of a RGGB pixel design. In this configuration, the addition of several green pixels allows for the capture of more green wavelengths that is needed for green color sensitivity need for the human eye, while at the same time capturing the infrared light for depth perception. It should be noted that the present scope should not be limited by the number or arrangements of pixel arrays, and that any number and/or arrangement is included in the present scope. FIG. 10*c* shows another arrangement of pixels according to yet another aspect.

Various imager configurations and components are contemplated, and any such should be considered to be within the present scope. Non-limiting examples of such components can include a carrier wafer, an antireflective layer, a dielectric layer, circuitry layer, a via(s), a transfer gate, an infrared filter, a color filter array (CFA), an infrared cut filter, an isolation feature, and the like. Additionally, such devices can have light absorbing properties and elements as has been disclosed in U.S. patent application Ser. No. 12/885,158, filed on Sep. 17, 2010 which is incorporated by reference in its entirety.

As has been described, a TOF pixel can have an on-pixel optical narrow band pass filter. The narrow band pass filter design can match the modulated light source (either LED or laser) emission spectrum and may significantly reduce unwanted ambient light that can further increase the signal to noise ratio of modulated infrared light. Another benefit of increased infrared QE is the possibility of high frame rate operation for high speed 3D image capture. An integrated infrared cut filter can allow a high quality visible image with high fidelity color rendering. Integrating an infrared cut filter onto the sensor chip can also reduce the total system cost of a camera module (due to the removal of typical IR filter glass) and reduce module profile (good for mobile applications).

The thickness and responsivity of a QE enhanced imager can have significant impact on a TOF pixel operation, due to the increased speed and detection. The increased QE will contribute to higher image signal to noise, which will greatly reduce depth error. Further, increased QE on a silicon material having a thickness of less than about 100 μm can allow the pixel to reduce the diffusion component of signal so that the charge collection and transfer speed can be increased, which is good for TOF pixel operation. In general, the photo-generated carrier created inside pixel will depend on two mechanisms for collection: drift and diffusion. For light having shorter wavelengths, most of the charge carriers will be generated in a shallow region of the device and within the depletion region of the diode. Those carriers can be collected relatively fast, via drift. For infrared light, the majority of photo carriers are be generated deeper inside the silicon material. To achieve higher QE, normally thick silicon layers are used. As such, most of the charge carriers carrier will be generated outside the diode's depletion region and will depend on diffusion to be collected. For a 3D TOF pixel, however, a fast sampling of photo generated charge is beneficial.

For the devices according to aspects of the present disclosure, a high QE can be achieved within a thin (i.e. less than 100 μm) layer of silicon material. Therefore, substantially all of the carriers generated can be collected via drift mechanism. This allows a fast charge collection and transfer.

FIG. 11 shows an exemplary schematic for a six-transistor (6-T) architecture which will allow global shutter operation according to one aspect of the present disclosure. The pixel can include a photodiode (PD), a global reset (Global_RST), a global transfer gate (Global_TX), a storage node, a transfer gate (TX1), reset (RST), source follower (SF), floating diffusion (FD), row select transistor (RS), power supply (Vaapix) and voltage out (Vout). Due to the use of extra transfer gate and storage node, correlated-double-sampling (CDS) is allowed. Therefore, the read noise should be able to match typical CMOS 4T pixels.

Figure 12:
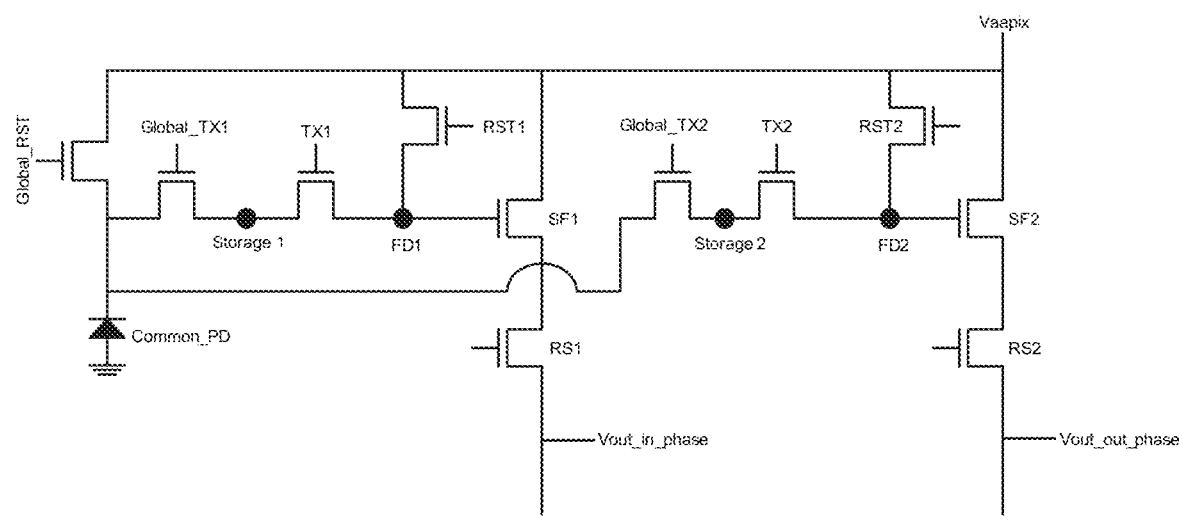
FIG. 12 is a schematic diagram of an eleven transistor imager in accordance with another aspect of the present disclosure.

FIG. 12 shows an exemplary schematic of a 3D TOF pixel according to one aspect of the present disclosure. The 3D TOF pixel can have 11 transistors for accomplishing the depth measurement of the target. In this embodiment the 3D pixel can comprise a photodiode (PD), a global reset (Global_RST), a first global transfer gate (Global_TX1), a first storage node, a first transfer gate (TX1), a first reset (RST1), a first source follower (SF1), a first floating diffusion (FD1), a first row select transistor (RS1), a second global transfer gate (Global_TX2), a second storage node, a second transfer gate (TX2), a second reset (RST2), a second source follower (SF2), a second floating diffusion (FD2), a second row select transistor (RS2), power supply (Vaapix) and voltage out (Vout). Other transistors can be included in the 3D architecture and should be considered within the scope of the present invention. The specific embodiment with 11 transistors can reduce motion artifacts due to the global shutter operation, thereby giving more accurate measurements.

As has been described, a photodiode array can be used in various communication applications. For example, the array can be used to detect pulsed optical signals. Such pulsed signals can be used to carry data at high speeds. By utilizing photodiodes having fast response times, very short pulse widths can be detected, thus increasing the speed of data communication. In one aspect, for example, the pulsed optical signals can have pulse widths from about 1 femtosecond to about 1 microsecond. In another aspect, the at least two photodiodes are operable to transmit data at a rate of at least 1 Gbps. In yet another aspect, the at least two photodiodes are operable to transmit data at a rate of at least 2 Gbps.

Figure 13:
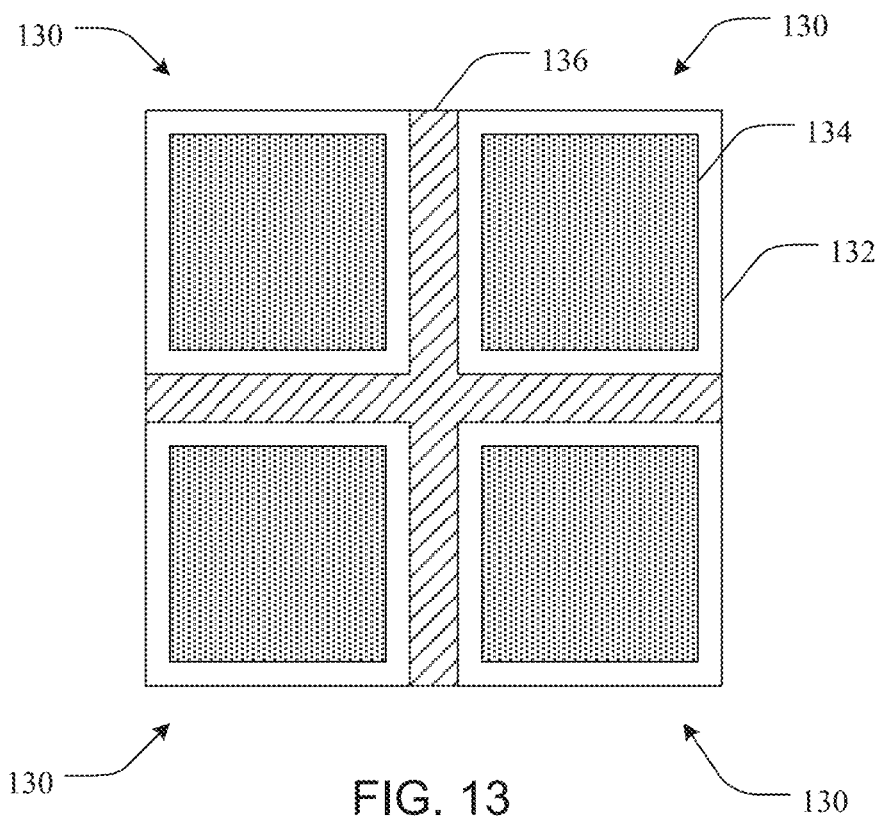
FIG. 13 is a schematic view of a photosensitive array device in accordance with yet a further aspect of the present disclosure.
Figure 14:
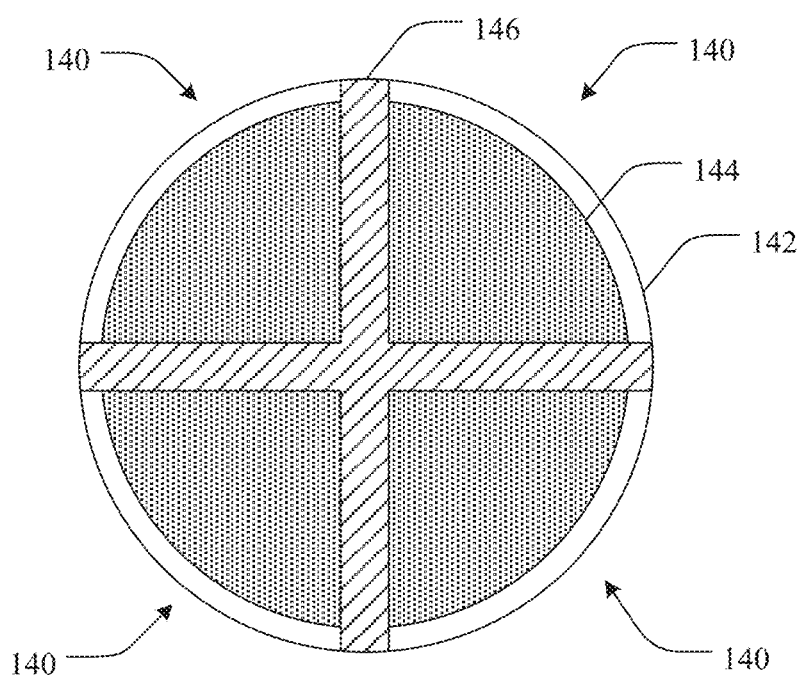
FIG. 14 is a schematic view of a photosensitive array device in accordance with another aspect of the present disclosure.

In one aspect, an array of four photodiodes forming a quad photodiode array (quad array) is provided. A quad array can be used in a variety of applications, including communications, laser range finding, laser alignment, and the like. In some aspects, the four photodiodes can have uniform photo response, or in other words, are selective to the same wavelength range. It can also be beneficial to have little to no electrical and/or optical cross talk between the photodiodes in the quad array. For this reason, isolation structures can be disposed between the photodiodes can be beneficial. Some application can also benefit from the high speed operation of the photodiodes according to aspects of the present disclosure. FIGS. 13 and 14 show exemplary configurations of quad arrays. FIG. 13 shows a quad array of four photodiodes 130 including a silicon material 132 and a doped region 134. The doped region is made up of multiple doped regions forming a junction. An isolation structure 136 is located between the photodiodes to electrically and/or optically isolate the photodiodes against undesirable cross talk. FIG. 14 shows a similar arrangement in a circular configuration. This array includes four photodiodes 140 including a silicon material 142, a doped region 144, and an isolation structure 146. In addition to those materials discussed herein, the isolation structure can include a dielectric material for electrical isolation and a metal material for a high reflectivity to the light incidence on the walls of the trench. In one aspect, the sides and surfaces of the diode between the isolation regions can be more heavily doped than the silicon material in order to pin the Fermi level at the band edge and reduce the dark current. The photodiode can also include a buried layer of opposite conductivity type to the silicon material. In some aspects, the doping of the silicon material can be kept low and the thickness can be thinned to provide a fast response time to the optical signal. A textured region can function to backside scatter light that passes through the silicon material, thus improving near infrared responsivity.

Figure 15:
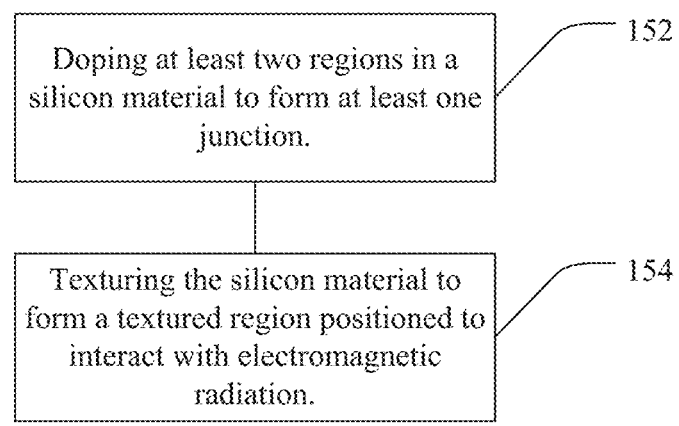
FIG. 15 is a depiction of a method of increasing the speed of an optoelectronic device in accordance with yet another aspect of the present disclosure.

In yet another aspect, a method of increasing the speed of an optoelectronic device is provided. As is shown in FIG. 15, such a method can include doping at least two regions in a silicon material to form at least one junction 152 and texturing the silicon material to form a textured region positioned to interact with electromagnetic radiation 154. The optoelectronic device has a response time of from about 1 picosecond to about 5 nanoseconds and a responsivity of greater than or equal to about 0.4 A/W for electromagnetic radiation having at least one wavelength from about 800 nm to about 1200 nm.

Of course, it is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, to function and manner of operation, assembly and use may be made without departing from the principles and concepts set forth herein.

What is claimed is:

1. A quantum efficiency enhanced optoelectronic device, comprising:
   a silicon device layer exhibiting a thickness in a range of about 1 micron to about 100 microns and having a first surface for receiving incident radiation;
   a first doped region at the first surface and a second doped region at the first surface forming at least one depletion region in the silicon device layer;
   a first contact connected to the first doped region;
   a textured region comprising a second contact, wherein the textured region is coupled to the silicon device layer and positioned on an opposite side of the first doped region and the second doped region and wherein the textured region is configured to interact with electromagnetic radiation that passes through the silicon device layer so as to increase the quantum efficiency of the optoelectronic device, wherein the optoelectronic device has a response time of from about 1 picosecond to about 5 nanoseconds and a responsivity of greater than or equal to about 0.4 A/W for electromagnetic radiation exhibiting at least one wavelength in a range of about 800 nanometers to about 1200 nanometers, and wherein the optoelectronic device is operable to determine a distance to an object based on a property of a reflected signal relative to an emitted optical signal.

2. The device of claim 1, wherein the optoelectronic device exhibits a quantum efficiency of greater than or equal to about 40% for electromagnetic radiation having a wavelength of about 940 nm.

3. The device of claim 1, wherein the silicon device layer exhibits a thickness in a range of about 1 micron to about 10 microns.

4. The device of claim 1, wherein the silicon device layer exhibits a thickness in a range of about 1 micron to about 5 microns.

5. The device of claim 1, wherein the textured region is formed via one of lasing, chemical etching, nanoimprinting, and reactive ion etching.

6. The device of claim 1, wherein the textured region is associated with the surface of the silicon device layer nearest the impinging electromagnetic radiation.

7. The device of claim 1, wherein the silicon device layer comprises an array of photodetectors.

8. The device of claim 7, further comprising an isolation structure disposed between each of the photodetectors.

9. The device of claim 8, wherein the isolation structure comprises one of dielectric materials, reflective materials, conductive materials, and combinations thereof.

10. The device of claim 1, wherein the property of the reflected signal relative to the emitted optical signal comprises a phase delay.

11. The device of claim 1, wherein the property is the time-of-flight.

12. The device of claim 1, further comprising a light source configured to emit an optical signal.

13. The device of claim 12, wherein the light source is configured to emit electromagnetic radiation at a wavelength of about 940 nm.

14. The device of claim 1, further comprising an infrared optical bandpass filter for reducing unwanted ambient light.

15. The device of claim 1, wherein a reverse bias voltage is applied between the first and second contacts to decrease the response time.

16. The device of claim 15, wherein the reverse bias voltage is in the range of 0.001 volts to 3 volts.

17. The device of claim 1, wherein a portion of the textured region is doped to create the second contact.

* * * * *